US005502356A

United States Patent [19]

McGeoch

[11] Patent Number: 5,502,356

[45] Date of Patent: Mar. 26, 1996

[54] STABILIZED RADIAL PSEUDOSPARK SWITCH

[75] Inventor: Malcolm W. McGeoch, Brookline, Mass.

[73] Assignee: Plex Corporation, Brookline, Mass.

[21] Appl. No.: 237,010

[22] Filed: May 2, 1994

[51] Int. Cl.[6] ........ H01J 7/24

[52] U.S. Cl. ........ 315/111.91; 315/111.21; 315/111.31; 315/111.71; 361/120; 361/130

[58] Field of Search ........ 315/111.91, 111.21, 315/111.31, 111.71; 361/120, 130; 313/231.31

[56] References Cited

U.S. PATENT DOCUMENTS

| | | | |
|---|---|---|---|
| 5,050,178 | 9/1991 | Bruckner et al. . | |
| 5,091,819 | 2/1992 | Christiansen et al. | 361/120 |
| 5,126,638 | 6/1992 | Dethlefsen | 315/326 |

OTHER PUBLICATIONS

J. Christiansen et al., Z. Phys. A290, pp. 35–41, 1979.

G. Mechtersheimer et al., J. Phys. E: Sci. Instrum. 20, p. 270, 1987.

K. Frank et al., Proc. 9th Intl. Pulsed Power Conf., San Diego, 1991, pp. 472–477.

D. Bloess et al., Nucl. Instrum. Methods 205, pp. 173–184, 1983.

G. Mechtersheimer et al., Report R103/84, Franco–German Research Institute of St. Louis, 1984.

G. F. Kirkman et al., Appl. Phys. Lett. 49, pp. 494–495, 1986.

G. F. Kirkman et al., Appl. Phys. Lett. 52, pp. 613–614. 1988.

H. Gundel et al., Appl. Phys. Lett. 54, pp. 2071–2073, 1989.

*Primary Examiner*—Robert J. Pascal

*Assistant Examiner*—Reginald A. Ratliff

*Attorney, Agent, or Firm*—Wolf, Greenfield & Sacks

[57] ABSTRACT

A pseudospark switch performs the rapid commutation of high electric currents at moderately high voltage, with minimal statistical uncertainty in the delay between triggering and commutation. The switch includes multiple parallel pseudospark channels, the channels being arranged radially. The switch is triggered by an injection of electrons from an auxiliary discharge present in a common hollow cathode region of the pseudospark channels. Structures within the cathode inhibit spontaneous firing of the switch. In particular, the operating voltage of the switch is greatly increased by the presence of an axial stabilizing electrode element inside the hollow cathode, which stabilizes the open circuit state of the switch. A bias electrode within the hollow cathode provides further stabilization when held at positive potential and enhances triggering when biased negatively relative to the hollow cathode.

17 Claims, 4 Drawing Sheets

STABILIZED RADIAL PSEUDOSPARK SWITCH

FIELD OF THE INVENTION

This invention relates to switches capable of rapidly conducting high currents with very small statistical uncertainty in the delay to closing. The timing accuracy allows multiple parallel connection of these switches to generate extremely high currents, of a level sufficient to drive, for example, plasma pinch sources of X-radiation.

BACKGROUND OF THE INVENTION

The pseudospark discharge is a spark-like gas discharge between electrodes having opposing holes, as described by J. Christiansen et al in *Z. Phys.* A290, pp. 35–41, 1979. The pseudospark discharge occurs when a certain voltage difference or gas pressure is exceeded. The breakdown characteristic of such an electrode pair shows an increasing breakdown voltage with decreasing gas pressure, a regime of operation previously well characterized as being on the left hand brand branch of the Paschen curve for gas breakdown. When a breakdown occurs, a diffuse discharge forms. The discharge can carry a high electric current of many tens of kiloamps in a single channel, without the concentrated electrode erosion that is characteristic of high pressure spark switches and vacuum switches. For this reason, the triggered pseudospark discharge switch is believed to offer the potential of very long life at high firing repetition rates.

In order to carry higher currents with faster rise times, and to distribute channel erosion over a larger area, numbers of pseudospark discharge channels have been connected in parallel, in what is termed a multi-channel pseudospark switch, or MUPS, as described by G. Mechtersheimer et al in *J. Phys. E: Sci. Instrum* 20, page 270, 1987. Multiple pseudospark discharge channels have been triggered simultaneously to increase the current carried. Several geometrical variants have been disclosed in the prior art. Configurations in which the channels are arranged in a line between parallel plates are disclosed in the aforementioned reference by G. Mechtersheimer et al and in U.S. Pat. No. 5,050,178 issued Sep. 17, 1991 to Bruckner et al. Configurations utilizing a compact cluster between parallel plates are disclosed by K. Frank et al, *Proc. 9th Intl. Pulsed Power Conf.*, San Diego, 1991, pp. 472–477 and U.S. Pat. No. 5,091,819 issued Feb. 25, 1992 to Christiansen et al. A single radial array between coaxial cylindrical electrodes is disclosed in the aforementioned reference by Frank et al, and a series of radial arrays between coaxial cylindrical electrodes is disclosed in U.S. Pat. No. 5,126,638 issued Jun. 30, 1992 to Dethlefsen.

A broad range of triggering mechanisms have been employed. The pseudospark discharge can be triggered by the introduction of electrons to the vicinity of the cathode hole, as disclosed by D. Bloess et al in *Nucl. Instrum. Methods* 205, pp. 173–184, 1983, thereby forming a rapid closing switch for the conduction of electricity. Methods that have been employed to produce electrons for this purpose include surface discharge, as disclosed in the aforementioned reference by D. Bloess et al; injection from a pulsed glow discharge, as disclosed by G. Mechtersheimer et al, Report R103/84, Franco-German Research Institute of St. Louis, 1984; photoproduction via laser, as disclosed by G. F. Kirkman et al, *Appl. Phys. Lett.* 49, pp. 494–495, 1986; photoproduction via flashlamp, as described by G. Kirkman et al, *Appl. Phys. Lett.* 52, pp. 613–614, 1988; and surface emission from a ferroelectric, as described by H. Gundel et al, *Appl. Phys. Lett.* 54, pp. 2071–2073, 1989.

All of the prior art multiple channel pseudospark switches have had one or more disadvantages, including large physical size and unstable operation resulting from spontaneous discharge in the pseudospark channels. The unstable operation reduces the voltage which the switch can hold off in the open state. It is an object of the present invention to provide a stabilized pseudospark switch which overcomes some or all of the aforementioned disadvantages.

SUMMARY OF THE INVENTION

The present invention relates to a stabilized radial pseudospark switch comprising a hollow cathode having an axis of symmetry and a hollow anode coaxial with and surrounding the cathode. The cathode and the anode include a plurality of aligned pairs of holes which define an array of pseudospark channels. The pseudospark channels have longitudinal axes which intersect at a point on the axis of symmetry. The pseudospark switch further comprises a stabilizing electrode element for controlling spontaneous anode-cathode current and for accelerating switch commutation. The stabilizing electrode element is located on the axis of symmetry in alignment with the pseudospark channels and is maintained at the electrical potential of the cathode. The pseudospark switch further comprises an auxiliary electrode for supplying electrons for causing switch commutation, an auxiliary voltage source for applying a positive potential between the auxiliary electrode and the cathode for maintaining the switch open circuit and for applying a negative potential between the auxiliary electrode and the cathode for causing switch commutation by the formation of discharges in the pseudospark channels. A vacuum-tight enclosure maintains a gas at a prescribed pressure in the region between the cathode and the anode.

In a preferred embodiment, the stabilizing electrode element comprises a conductive pin affixed to the cathode and having a diameter that is at least as great as the diameter of the holes which define the pseudospark channels. The stabilizing electrode element is preferably fabricated of a refractory metal such as tungsten.

In a first embodiment, the cathode and the anode include cylindrical portions containing the aligned pairs of holes. In this embodiment, the pseudospark channels are radial with respect to the axis of symmetry. In a second embodiment, the cathode and the anode include truncated conical portions containing the aligned pairs of holes. In a third embodiment, the cathode and the anode include spherical portions containing the aligned pairs of holes.

The pseudospark switch may further include a bias electrode positioned within the hollow cathode in proximity to the pseudospark channels and the stabilizing electrode element, and a bias voltage source for applying a positive potential between the bias electrode and the cathode when the switch is open circuit and for applying a negative potential between the bias electrode and the cathode when the switch is commutated. In a preferred embodiment, the bias electrode comprises a hollow cylinder coaxial with the cathode.

The pressure within the vacuum tight enclosure is preferably in a range of about 30 to 300 microns. The gas within the pseudospark switch is preferably hydrogen or deuterium.

In a preferred embodiment, the anode defines an annular anode cavity surrounding the pseudospark channels. A beam dump is located within the annular anode cavity in alignment with the pseudospark channels. The beam dump preferably comprises a refractory metal such as tungsten.

BRIEF DESCRIPTION OF THE DRAWINGS

For a better understanding of the present invention, reference is made to the accompanying drawings, which are incorporated herein by reference and in which.

DETAILED DESCRIPTION

The present invention provides a switch for the rapid commutation of electric current. It utilizes the pseudospark switch principle in a radially distributed array of pseudospark channels and introduces elements to control spontaneous switch leakage current and to provide rapid low jitter triggering of the switch. Jitter is defined as the statistical uncertainty in the delay between a trigger impulse and commutation. A plurality of pseudospark discharge channels is arranged radially, with a common hollow cathode at an axial location. Within the hollow cathode, a stabilizing electrode element stabilizes the switch in a nonconducting, or open circuit, state. The stabilizing electrode element is an on-axis projection inside the hollow cathode which blocks ion movement between pseudospark channels. This not only stabilizes the switch to much higher holdoff voltages than would otherwise be possible, but also accelerates the process of triggered switch breakdown by providing a surface for secondary electron production close to the entrance of each pseudospark channel.

One of the aims of the present invention is to provide a geometry which makes a pseudospark switch sufficiently compact to fit within the cylindrical envelope typical of other switch tubes, such as the thyratron. To this end, a radial array of pseudospark channels is utilized. This geometry has the inherent advantage over linear or coaxial arrays of having the cathode holes of all the channels in extremely close proximity, thereby enabling the breakdown of one channel to feed electrons to the others and causing spontaneous ignition of all the pseudospark channels. The present invention provides a novel structure for the control of the above-mentioned spontaneous discharge which otherwise draws rapidly increasing current as the switch voltage is increased and eventually reaches unstable levels at high voltage.

The timing accuracy of the pseudospark switch of the present invention permits multiple parallel connection of these switches to generate extremely high currents (0.1 to 1 million amps), of a level sufficient to drive plasma pinch sources of X-radiation. The switch may also be used to supply power to pulsed gas laser discharges in which the very low inductance of the switch is an advantage. A third class of application is in the provision of current to devices which remove pollutants from a gas stream by the passage of a pulsed electric discharge.

Figure 1:
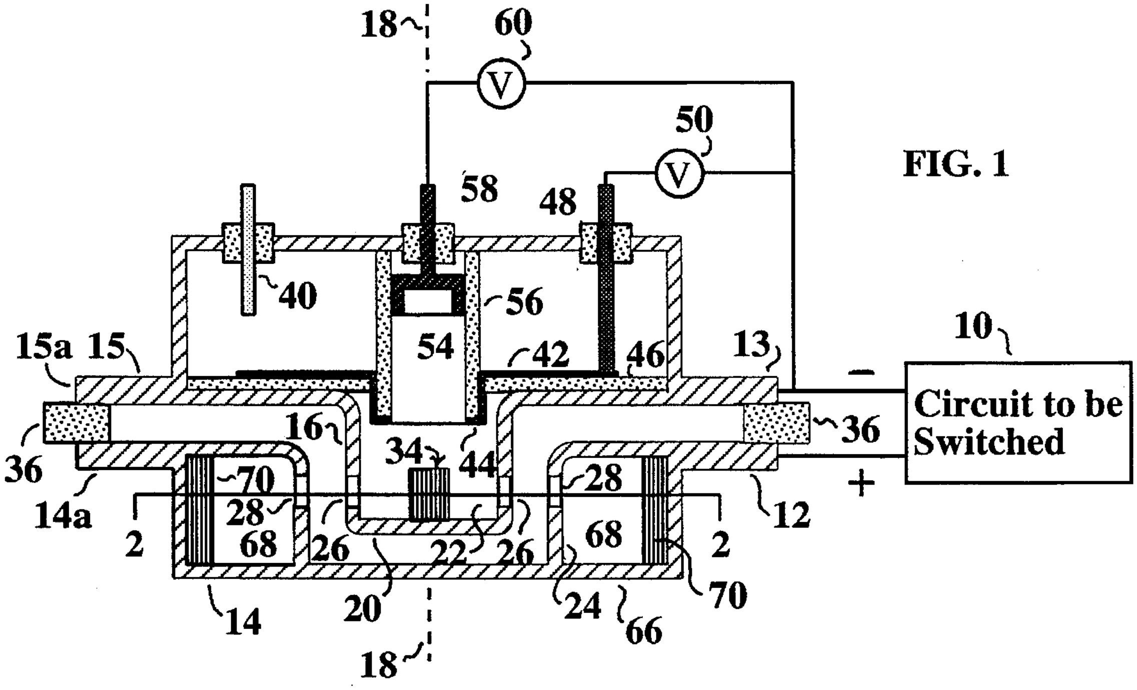
FIG. 1 is a cross-sectional, schematic view of a stabilized radial pseudospark switch in accordance with the present invention.
Figure 2:
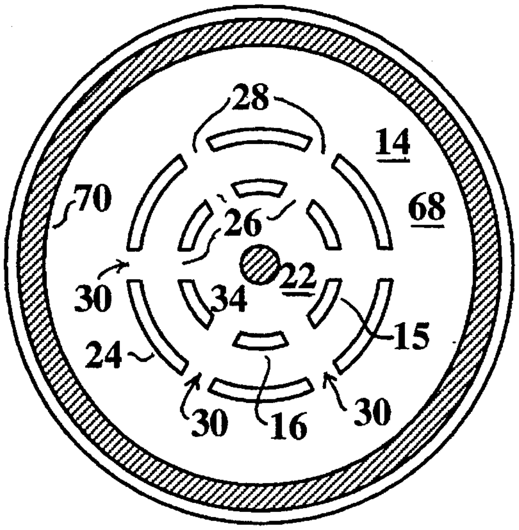
FIG. 2 is a cross-sectional view of the stabilized radial pseudospark switch taken along the line 2—2 of FIG. 1.

A first embodiment of the stabilized radial pseudospark switch of the present invention is shown in FIGS. 1 and 2. A circuit 10 to be switched is shown as a black box with terminals attached to a positive switch terminal 12 and a negative switch terminal 13. The positive switch terminal 12 is located on an anode 14, and the negative switch terminal 13 is located on a cathode 15. The cathode 15 includes a hollow cylindrical portion 16 having an axis of symmetry 18, and a base portion 20 that closes the lower end of cylindrical portion 16. Together, the cylindrical portion 16 and the base portion 20 define a cup-like configuration having a hollow interior region 22. The anode 14 includes a hollow cylindrical portion 24 which surrounds and is coaxial with the cylindrical portion 16 of cathode 15. The cylindrical portion 16 of cathode 15 is provided with a plurality of spaced holes 26, and the cylindrical portion 24 of anode 14 is provided with an equal number of spaced holes 28. The respective pairs of holes 26 and 28 are radially aligned to define radial pseudospark channels 30 perpendicular to axis of symmetry 18. The example shown in FIGS. 1 and 2 has six pseudospark channels 30. The pseudospark channels 30 form a radial array, with longitudinal axes of the pseudospark channels 30 intersecting at a point on the axis of symmetry 18. Any number of pseudospark channels equal to or greater than two can be utilized in the pseudospark switch of the present invention.

Located within the cylindrical portion 16 of cathode 15 and electrically connected to it is a stabilizing electrode element 34. The stabilizing electrode element 34 has the form of a conducting pin of diameter comparable to or greater than the diameters of holes 26 and 28. As shown in FIGS. 1 and 2, the stabilizing electrode element 34 is attached to the base portion 20 of cathode 15, is located on axis of symmetry 18 and is aligned with pseudospark channels 30. The stabilizing electrode element 34 is maintained at the electrical potential of cathode 15. Preferably, the stabilizing electrode element 34 is fabricated of a refractory metal, such as tungsten.

The stabilizing electrode element 34 is of sufficient radial extent to create a barrier to ions entering the hollow interior region 22 of cathode 15 through the holes 26 and to reverse the motion of these ions and remove their energy so that they do not create further free electrons, either within the hollow cathode or in an opposing pseudospark channel by ionization of the low pressure gas in the switch. The stabilizing electrode element 34 occupies the axial region of the hollow interior region 22 of cathode 15, thereby blocking the volume production of electrons and ions, with the effect that spontaneous switch currents are inhibited.

A secondary function of the stabilizing electrode element 34 is to provide accelerated switch breakdown. The stabilizing electrode element 34 is maintained at the same electrical potential as the hollow cylindrical portion 16 of cathode 15, so that secondary electrons created on the surface of the stabilizing electrode element by the ion flux during breakdown can rapidly reenter the pseudospark channels. The distance that an incoming ion has to travel before producing secondary electrons on the surface of the stabilizing electrode element 34, and therefore the time taken, is reduced by the close proximity of the stabilizing electrode element 34 to the cathode holes 26.

It is a further function of the stabilizing electrode element 34 to provide a beam dump for ions generated during breakdown of the pseudospark channels. For this reason, the stabilizing electrode element 34 is preferably fabricated of a refractory metal as described above.

An annular insulator 36 is sealed between an outer rim portion 15*a* of cathode 15 and an outer rim portion 14*a* of anode 14 to electrically isolate the electrodes and to form a vacuum-tight enclosure. A gas port 40 may be provided for evacuation of the switch enclosure and for filling of the interior with a gas at a controlled pressure. Preferably, the interior of the switch is filled with hydrogen or deuterium at a pressure of about 30 to 300 microns. Alternatively, a reservoir device may be provided in the switch. Heat is applied to a metal matrix containing hydrogen or deuterium gas to release a controlled quantity of gas into the previously-evacuated and sealed switch interior. This type of reservoir is routinely used in hydrogen thyratron switches and allows variation of the switch internal pressure while the switch remains sealed.

A bias electrode 42 may be located in proximity to the stabilizing electrode element 34 and the pseudospark channels 30. In a preferred embodiment, the bias electrode 42 includes a hollow cylindrical portion 44 which is coaxial with axis of symmetry 18. The bias electrode 42 is electrically isolated from the cathode 15 by an insulator 46. The bias electrode 42 is connected through a vacuum feedthrough 48 to a bias voltage source 50. The bias voltage source 50 is electrically connected between bias electrode 42 and cathode 15. The voltage source 50 supplies a positive bias with respect to cathode 15 to maintain the switch in an open state and is pulsed negative with respect to the cathode to induce switch commutation.

The bias electrode 42, located in close proximity to the end of the stabilizing electrode element 34, is biased positive with respect to the stabilizing electrode element 34 and the surrounding cathode when the switch is open circuit. The bias electrode 42 attracts electrons from the interior of the hollow interior region 22 of cathode 15, thereby inhibiting spontaneous switch currents and stabilizing the switch in its open state.

An auxiliary electrode 54 is located on the axis of symmetry 18 and is spaced from the pseudospark channels 30 and the stabilizing electrode element 34. A hollow cylindrical insulator 56 supports and electrically isolates auxiliary electrode 54 and bias electrode 42 within the switch enclosure. The auxiliary electrode 54 is connected through a vacuum feedthrough 58 to an auxiliary voltage source 60. The auxiliary voltage source 60 is electrically connected between auxiliary electrode 54 and cathode 15. The auxiliary voltage source 60 supplies a positive voltage with respect to cathode 15 to maintain a continuous auxiliary discharge between auxiliary electrode 54 and the interior region 22 of the hollow cylindrical portion 16 of cathode 15. Auxiliary electrode 54 is pulsed negative with respect to the cathode 15 to induce switch commutation.

The auxiliary electrode 54 is located in direct view of the interior region 22 of hollow cylindrical portion 16 of cathode 15, and a continuous gas discharge is run between the auxiliary electrode 54 and the cathode 15. The discharge, because it has a positive space charge within the hollow cathode, attracts electrons away from the pseudospark channel holes and therefore inhibits spontaneous switch currents in the open state.

The anode 14 includes a hollow toroidal portion which defines an annular anode cavity 68 that surrounds the pseudospark channels 30, as best shown in FIG. 2. The anode cavity 68 is within the vacuum-tight enclosure of the switch. A beam dump 70 located within the anode cavity 68 in alignment with pseudospark channels 30 absorbs the energy of electrons accelerated within the pseudospark channels during switch commutation. The beam dump 70 is preferably a refractory metal, such as tungsten.

In operation, the auxiliary voltage source 60 applies a voltage to auxiliary electrode 54 which is positive with respect to cathode 15 in order to maintain a continuous discharge between electrodes 54 and 15. This discharge is referred to as the auxiliary discharge and supplies electrons for triggering of the switch. The circuit 10 to be switched is connected between terminals 13 and 12. The switch remains open circuit between terminals 12 and 13 as long as electrode 54 of the auxiliary discharge remains positive with respect to the cathode 15. Higher open circuit potential between the terminals 12 and 13 can be achieved when bias electrode 42 is also maintained by bias voltage source 50 at a positive potential with respect to cathode 15.

Commutation of the switch, i.e. the onset of conduction between terminals 12 and 13, is initiated by the abrupt application to electrode 54 by voltage source 60 of a negative potential of several kilovolts with respect to cathode 15. The time delay between this event and commutation is shortened if, simultaneously, bias electrode 42 is also driven by voltage source 50 to a negative potential with respect to cathode 15. The process of commutation includes the simultaneous formation of discharges between anode 14 and cathode 15 at each of the pseudospark channels 30. The sudden reversal of the potential of auxiliary electrode 54 with respect to cathode 15 causes electrons from the auxiliary discharge to be injected into the interior region 22 of hollow cylindrical portion 16 of cathode 15. These electrons generate ionization avalanches in the pseudospark channels 30, forming a dense plasma in each pseudospark channel. The plasma is a low resistance path between anode 14 and cathode 15. During commutation, stabilizing electrode element 34 enhances the formation of discharges in the pseudospark channels 30 by intercepting positive ions entering from the gap between anode 14 and cathode 15 and generating secondary electrons which reenter the gap and reinforce the avalanche process.

An example of the stabilized radial pseudospark switch of FIGS. 1 and 2 was constructed. The switch had the dimensions and operating parameters listed in Table I below. It will be understood that these dimensions and operating parameters are in no way limiting as to the scope of the present invention, but are given by way example.

TABLE I

| | |
|---|---|
| Diameter of stabilizing electrode element 34 | 0.24" |
| Diameter of cylindrical portion 16 of cathode 15 | 1.0" |
| Diameter of cylindrical portion 24 of anode 14 | 1.5" |
| Pseudospark channel 30 diameter | 0.2" |
| Number of channels | 6 |
| Gas-fill | hydrogen |
| Gas pressure | 200 microns |
| Hold off voltage | 30 kilovolts |
| Firing jitter | 10 nanoseconds |
| Pulse duration | 160 nanoseconds |
| Peak current | 60 kiloamps |
| Repetition rate | 10 Hz |
| Test duration | >3 × $10^5$ pulses |

Figure 3:
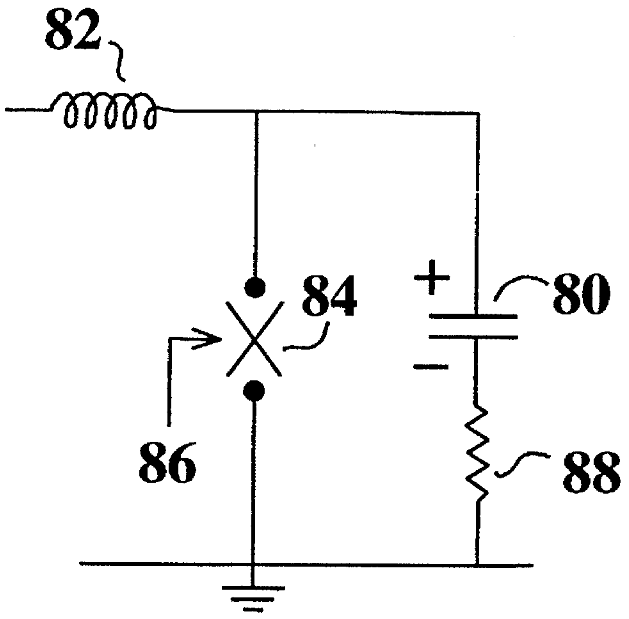
FIGS. 3 and 4 are schematic diagrams which illustrate applications of the pseudospark switch.
Figure 4:
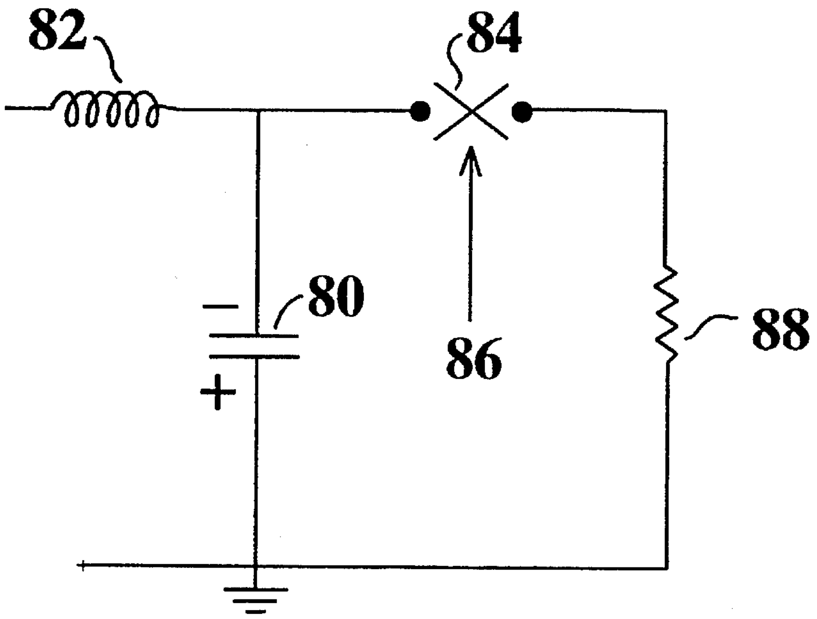

In many applications, particularly in electron guns, a negative polarity electrical pulse is needed. In order to employ a pseudospark switch in a circuit generating output pulses of negative polarity, it is particularly convenient to have both the switch cathode and the switch trigger circuit operating close to ground potential. An arrangement for achieving this is illustrated in FIG. 3. An energy storage capacitor 80 is charged through an inductor 82. A pseudospark switch 84 is triggered by an electrical input 86 to couple power to a load 88. The present invention provides a pseudospark switch triggered near cathode potential in order to drive circuits of the configuration shown in FIG. 3. This is achieved by providing a source of electrons within the hollow cathode volume that is shared in common by the pseudospark channels in the radial array. An alternate arrangement shown in FIG. 4 also supplies a negative pulse, but the whole switch 84 must float to the generated negative potential during conduction. This configuration poses difficulties in the mounting of the pseudospark switch as well as in the electrical isolation of the trigger circuit and is less desirable than the configuration shown in FIG. 3.

Figure 5:
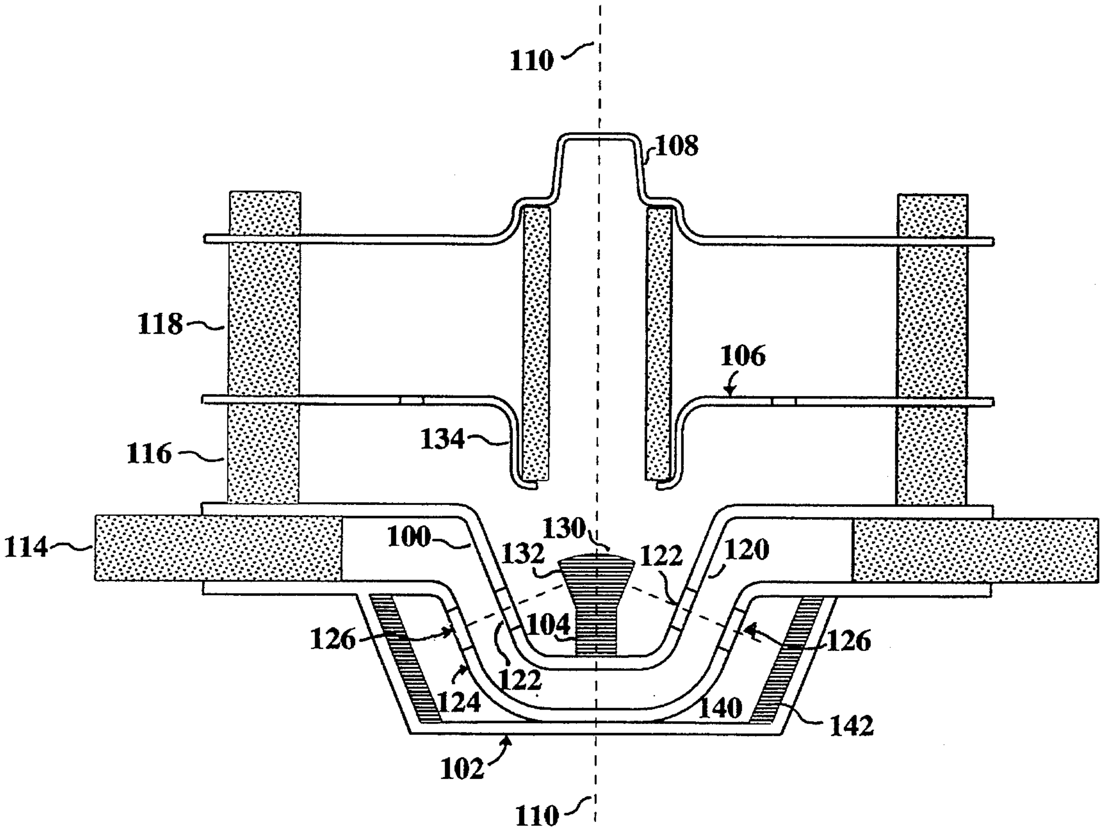
FIG. 5 is a cross-sectional, schematic view of a second embodiment of the stabilized radial pseudospark switch of the present invention.

A second embodiment of the stabilized radial pseudospark switch in accordance with the present invention is shown in FIG. 5. The switch includes a cathode 100, an anode 102, a stabilizing electrode element 104, a bias electrode 106 and an auxiliary electrode 108. The electrodes have an axis of symmetry 110. Insulators 114, 116 and 118 isolate the respective electrodes and complete the vacuum-tight enclosure of the pseudospark switch. The circuit to be switched and the voltage sources are omitted from FIG. 5 for simplicity.

The structure of the switch shown in FIG. 5 is similar to that of the switch shown in FIGS. 1 and 2 and described above, with the following exceptions. The cathode 100 includes a hollow truncated conical portion 120 having a plurality of spaced holes 122. The anode 102 includes a hollow truncated conical portion 124 coaxial with and surrounding truncated conical portion 120 and having a plurality of spaced holes 126. Respective pairs of holes 122 and 126 are aligned to define pseudospark channels. The longitudinal axes of the pseudospark channels intersect at a point 130 on the axis of symmetry 110. The pseudospark channels defined by holes 122 and 126 extend downwardly from point 130 at an angle with respect to the axis of symmetry 110. The stabilizing electrode element 104 is located on axis of symmetry 110 and is attached to cathode 100. An upper portion 132 of stabilizing electrode element 104 is tapered outwardly so that its surface is orthogonal to the pseudospark channels defined by holes 122 and 126. The bias electrode 106 includes a portion 134 which terminates in proximity to holes 122 and stabilizing electrode element 104. The anode 102 defines an annular anode cavity 140 containing a beam dump 142 located in alignment with the pseudospark channels. The pseudospark switch of FIG. 5 operates as described above in connection with the switch shown in FIGS. 1 and 2.

Figure 6:
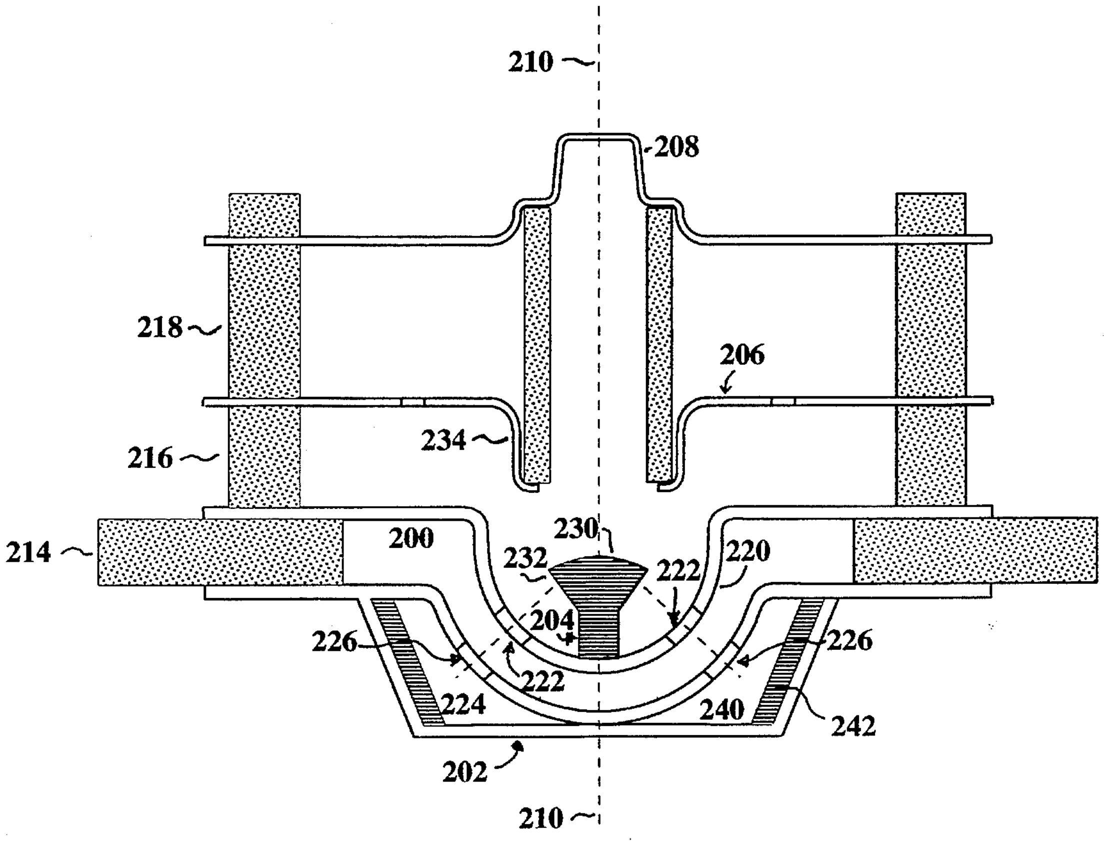
FIG. 6 is a cross-sectional, schematic view of a third embodiment of the stabilized radial pseudospark switch of the present invention.

A third embodiment of the stabilized radial pseudospark switch in accordance with the present invention is shown in FIG. 6. The switch includes a cathode 200, an anode 202, a stabilizing electrode element 204, a bias electrode 206 and an auxiliary electrode 208. The electrodes have an axis of symmetry 210. Insulators 214, 216, and 218 isolate the respective electrodes and complete the vacuum-tight enclosure of the pseudospark switch. The circuit to be switched and the voltage sources are omitted from FIG. 6 for simplicity.

The structure of the switch shown in FIG. 6 is similar to that of the switch shown in FIGS. 1 and 2 and described above, with the following exceptions. The cathode 200 includes a hollow spherical portion 220 having a plurality of spaced holes 222. The anode 202 includes a hollow spherical portion 224 concentric with and surrounding spherical portion 220 and having a plurality of spaced holes 226. Respective pairs of holes 222 and 226 are aligned to define pseudospark channels. The longitudinal axes of the pseudospark channels intersect at a point 230 on the axis of symmetry 210. The pseudospark channels defined by holes 222 and 226 extend downwardly from point 230 at an angle with respect to the axis of symmetry 210. The stabilizing electrode element 204 is located on axis of symmetry 210 and is attached to cathode 200. An upper portion 232 of stabilizing electrode element 204 is tapered outwardly so that its surface is orthogonal to the pseudospark channels defined by holes 222 and 226. The bias electrode 206 includes a portion 234 which terminates in proximity to holes 222 and the stabilizing electrode element 204. The anode 202 defines an annular anode cavity 240 containing a beam dump 242 located in alignment with the pseudospark channels. The pseudospark switch of FIG. 6 operates as described above in connection with the switch shown in FIGS. 1 and 2.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A stabilized radial pseudospark switch comprising:

a hollow cathode having an axis of symmetry;

a hollow anode coaxial with and surrounding said cathode, said cathode and said anode including a plurality of aligned pairs of holes which define an array of pseudospark channels, said pseudospark channels having longitudinal axes which intersect at a point on said axis of symmetry;

a stabilizing electrode element for controlling spontaneous anode-cathode current and for accelerating switch commutation, said stabilizing electrode element being located on said axis of symmetry in alignment with said pseudospark channels and being maintained at the electrical potential of said cathode;

an auxiliary electrode for supplying electrons for causing switch commutation;

an auxiliary voltage source for applying a positive potential between the auxiliary electrode and the cathode for maintaining the switch open circuit and for applying a negative potential between the auxiliary electrode and the cathode for causing switch commutation by the formation of discharges in said pseudospark channels; and a vacuum-tight enclosure for maintaining a gas at prescribed pressure in a region between said cathode and said anode.

2. A stabilized radial pseudospark switch as defined in claim 1 wherein said cathode has a cup-like configuration and wherein said stabilizing electrode element comprises a conductive pin affixed to said cathode.

3. A stabilized radial pseudospark switch as defined in claim 2 wherein said stabilizing electrode element has a diameter that is at least as great as the diameter of the holes which define said pseudospark channels.

4. A stabilized radial pseudospark switch as defined in claim 1 wherein said stabilizing electrode element is fabricated of a refractory metal.

5. A stabilized radial pseudospark switch as defined in claim 4 wherein said stabilizing electrode element is fabricated of tungsten.

6. A stabilized radial pseudospark switch as defined in claim 1 wherein said cathode and said anode include cylindrical portions containing said aligned pairs of holes.

7. A stabilized radial pseudospark switch as defined in claim 1 wherein said cathode and said anode include truncated conical portions containing said aligned pairs of holes.

8. A stabilized radial pseudospark switch as defined in claim 1 wherein said cathode and said anode include concentric spherical portions containing said aligned pairs of holes.

9. A stabilized radial pseudospark switch as defined in claim 1 further including a bias electrode positioned within said hollow cathode in proximity to said pseudospark channels and said stabilizing electrode element, and a bias voltage source for applying a positive potential between the bias electrode and the cathode when the switch is open circuit and for applying a negative potential between the bias electrode and the cathode when the switch is commutated.

10. A stabilized radial pseudospark switch as defined in claim 9 wherein said bias electrode comprises a hollow cylinder coaxial with said cathode.

11. A stabilized radial pseudospark switch as defined in claim 1 wherein said prescribed pressure is in a range of about 30–300 microns.

12. A stabilized radial pseudospark switch as defined in claim 11 wherein said gas is selected from the group consisting of hydrogen and deuterium.

13. A stabilized radial pseudospark switch as defined in claim 1 wherein said anode defines an annular anode cavity surrounding said pseudospark channels and wherein said anode includes a beam dump within said annular anode cavity in alignment with said pseudospark channels.

14. A stabilized radial pseudospark switch as defined in claim 13 wherein said beam dump comprises a refractory metal.

15. A stabilized radial pseudospark switch as defined in claim 14 wherein said refractory metal comprises tungsten.

16. A stabilized radial pseudospark switch as defined in claim 1 wherein said vacuum-tight enclosure comprises said anode, said cathode and an insulator sealed between said cathode and said anode.

17. A stabilized radial pseudospark switch as defined in claim 1 wherein said auxiliary electrode is located on said axis of symmetry and is spaced from said pseudospark channels.

* * * * *